(12) United States Patent
Horsley

(10) Patent No.: US 6,465,355 B1
(45) Date of Patent: Oct. 15, 2002

(54) METHOD OF FABRICATING SUSPENDED MICROSTRUCTURES

(75) Inventor: David Horsley, San Francisco, CA (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/844,356

(22) Filed: Apr. 27, 2001

(51) Int. Cl.⁷ .............................. H01L 21/311
(52) U.S. Cl. .................. 438/694; 438/699; 438/700
(58) Field of Search .................. 438/694, 699, 438/700, 52, 411, 412, 619

(56) References Cited

U.S. PATENT DOCUMENTS

| | | | |
|---|---|---|---|
| 5,198,390 A | * 3/1993 | MacDonald et al. | 438/52 |
| 5,314,572 A | 5/1994 | Core et al. | 156/643 |
| 5,364,497 A | 11/1994 | Chau et al. | 156/645 |
| 5,543,013 A | * 8/1996 | Tsang et al. | 156/643.1 |
| 5,637,539 A | 6/1997 | Hofmann et al. | 438/20 |
| 5,747,353 A | * 5/1998 | Bashir et al. | 438/50 |
| 5,824,177 A | * 10/1998 | Yoshihara et al. | 156/250 |
| 5,879,963 A | * 3/1999 | Howe et al. | 438/52 |
| 6,020,215 A | 2/2000 | Yagi et al. | 438/52 |

* cited by examiner

Primary Examiner—Benjamin L. Utech
Assistant Examiner—Kin-Chan Chen
(74) Attorney, Agent, or Firm—Trueman H. Denny III

(57) ABSTRACT

A method of fabricating a non-perforate suspended platform on a bonded-substrate is disclosed. The method includes forming a dielectric layer on a support surface of a base substrate followed by patterning an interface surface of the dielectric layer to define a well feature. The well feature is etched until a well having a depth that leaves a thin protective layer of the dielectric layer covering the support surface. Next a platform substrate is urged into contact with the base substrate followed by annealing the base and platform substrates to fusion bond the interface surface with a mounting surface of the platform substrate. The platform substrate is thinned, to form a membrane over a sealed cavity defined by the well and the mounting surface. The membrane is patterned and etch to form a plurality of trenches that extend through the membrane to the sealed cavity and define a suspended platform and a flexure. A selective etch material such as HF is used to remove the remaining dielectric layer from beneath the platform and the flexures thereby freeing the suspended platform and the flexures.

17 Claims, 5 Drawing Sheets

_US 6,465,355 B1_

METHOD OF FABRICATING SUSPENDED MICROSTRUCTURES

FIELD OF THE INVENTION

The present invention relates generally to a method of fabricating a suspended microstructure. More specifically, the present invention relates to a method of fabricating a suspended microstructure that eliminates the need to form through holes in the suspended microstructure that reduce a useful surface area of the suspended microstructure.

BACKGROUND ART

Suspended platforms are useful in applications where the advantages of microelectronic fabrication techniques can be used to form microstructures such as accelerometers, pressure sensors, actuators, fluidic devices, biochemical devices, and miniature machines. Micro-Electro-Mechanical Systems (MEMS) are one example of a system that can incorporate a suspended platform.

For instance, MEMS can integrate micromechanical elements and electronic elements on a common substrate material such as a silicon wafer. Microelectronic fabrication techniques can be used to fabricate the electronic elements such as CMOS circuits, for example. On the other hand, the micromechanical elements can be fabricated using micromachining techniques that deposit layers of materials to form mechanical and electromechanical devices or that selectively etch one or more layers of material such as a layer of silicon or a layer of silicon oxide to form mechanical and electromechanical devices.

A prior method for fabricating a suspended structure from single crystal silicon (Si) is illustrated in FIGS. 1a through 1d. FIG. 1a illustrates a prior structure 100 including an upper wafer 108 having a platform 102 that is suspended by flexures 104. The platform 102 includes several holes 114 that extend all the way through the platform 102. That is, the holes 114 perforate the platform 102.

FIGS. 1b through 1d are a cross-sectional view taken along line AA of FIG. 1a that illustrate a process for fabricating the prior structure 100. The process begins with a bonded silicon-on-insulator wafer 106 that includes the upper wafer 108 that is chemically bonded to a lower wafer 110 by a thin silicon oxide ($SiO_2$) layer 112 (i.e. a layer of dielectric material). The process for forming the bonded silicon-on-insulator wafer 106 are well understood in the microelectronics art.

Next, a top surface 124 of the upper wafer 108 is patterned using conventional photolithography techniques and then the upper wafer 108 is etched to form trenches 103 that define the flexures 104 and the platform 102 as well as a regularly spaced array of the holes 114 as illustrated in FIG. 1c. The trenches 103 extend through the upper wafer 108.

The holes 114 are through holes (i.e. they extend all the way trough the platform 102) and are required to allow the silicon oxide ($SiO_2$) layer 112 to be removed from beneath the platform 108 in a subsequent etching step.

In FIG. 1d, the bonded silicon-on-insulator wafer 106 is exposed to a selective etch material such as hydrofluoric acid (HF). The etch material flows through the holes 114 and dissolves the silicon oxide layer 112 that is beneath the platform 102 thereby freeing the platform 102 from the silicon oxide layer 112. The holes 114 are required in order to reduce the distance an etch front of the etch material must travel to free the platform 102. The silicon oxide layer 112 surrounding the platform 112 is undercut by a distance 122 that is approximately equal to one-half a hole-to-hole spacing 120 (i.e. the space between holes 114, see FIG. 1a).

A major disadvantage to the prior structure 100 is that the holes 114 reduce the surface area available on the platform 102. For instance, in ultrahigh density data storage applications, the platform 102 may include one or more layers of a storage medium that stores data as an alterable state of the storage medium. Optical or electron emission means (i.e. a laser or an electron beam) can be used to read and/or write data to the storage medium. It is undesirable to have the platform 102 perforated with the holes 114 because the holes 114 reduce the surface area of the platform 102 available for the storage medium. Moreover, an addressing scheme for reading or writing data to the storage medium must take into account the locations of the holes 114 to prevent reading or writing to an area in which the storage medium is non-existent. Because the holes 114 only serve to facilitate the removal of the silicon oxide layer 112 from beneath the platform 102, they are a non-functional feature of the platform 102. Accordingly, it is desirable to eliminate the holes 114 as they serve no useful purpose once the platform 102 has been formed.

Another prior method for fabricating a suspended structure from single crystal silicon (Si) is illustrated in FIGS. 2a through 2c. FIG. 2a illustrates a prior structure 200 including an upper wafer 208 having a platform 202 that is suspended by flexures 204.

FIGS. 2b through 2c are a cross-sectional view taken along line AA of FIG. 2a that illustrate a process for fabricating the prior structure 200. The process begins with a bonded silicon-on-insulator wafer 206 that includes the upper wafer 208 that is chemically bonded to a lower wafer 210 by a thin silicon oxide ($SiO_2$) layer 212. In FIG. 2b, prior to bonding the upper wafer 208 to the lower wafer 210, the thin silicon oxide layer 212 is patterned and then etched to form a well. The well becomes a sealed cavity 216 after the upper and lower wafers (206, 208) are bonded to each other.

Next, in FIG. 2c, a top surface 220 of the upper wafer 208 is patterned and then etched to form trenches 203 that define the flexures 204 and the platform 202. The trenches 203 extend through the upper wafer 208 to the sealed cavity 216. As a result of the etching, an upper surface 222 of the lower wafer 210 is exposed to the etching material and is subsequently etched to form shallow pits 218 that extend inward of the upper surface 222 as illustrated in FIG. 2c.

Consequently, one disadvantage of the method for fabricating the prior structure 200 is that the fabrication results in damage to the upper surface 222 of the lower wafer 210. In some applications the lower wafer 210 may contain buried components such as electrodes, interconnect structures, circuitry, or some other element that is essential to the functioning of the structure 200. Therefore, it is desirable to protect those components during the fabrication process. Conversely, the method for fabricating the prior structure 200 can result in damaging those components because the upper surface 222 is not protected from the etch material during the fabrication process.

Accordingly, there exists a need for a method for fabricating a suspended microstructure that does not require etch holes to remove a layer of material from beneath the suspended microstructure.

There is also a need for a method of fabricating suspended microstructures that protects (i.e. does not damage) an upper surface of a lower wafer from etch materials during the fabrication process so that components that are buried in the lower wafer are not damaged by the etch materials.

SUMMARY OF THE INVENTION

A method of fabricating a suspended platform of the present invention solves the aforementioned needs. The method of fabricating a suspended platform according to the present invention does not require etch holes in the suspended platform to remove a layer of material beneath the suspended platform. As a result, the suspended platform is non-perforate and substantially all of the surface area of the suspended platform is available for use.

Moreover, the method of fabricating a suspended platform according to the present invention prevents pitting of an upper surface of a lower wafer by covering the upper surface with a thin layer of material that protects the upper surface during etching.

Broadly, the present invention is embodied in a method for fabricating a suspended platform on a bonded-substrate. The bonded-substrate includes a platform substrate that is bonded to a base substrate. The method includes forming a dielectric layer on a support surface of the base substrate and then patterning and etching an interface surface of the dielectric layer to form a well that extends inward of the interface surface. The well has a preselected depth that leaves a thin layer of the dielectric layer covering the support surface. The base and platform substrates are then bonded to each other to form the bonded-substrate by urging the interface surface into contact with a mounting surface of the platform substrate and annealing the base and platform substrates to fusion bond the interface surface with the mounting surface. Once bonded, the well and the mounting surface form a sealed cavity. The platform substrate is thinned to form a thin membrane (of platform substrate material) over the sealed cavity. The membrane is patterned to define a platform feature and a flexure feature. The membrane is then etched to form trenches that extend all the way trough the membrane to the sealed cavity. The trenches define a platform (also called a microstructure) and one or more flexures that connect the platform with the platform substrate. Finally, the dielectric material beneath the platform is removed by applying a selective etch material. The selective etch material removes substantially all of the dielectric material from beneath the platform without substantially undercutting an interface between the interface layer and the mounting surface so that the chemical bond between the base substrate and the platform substrate is not damaged by the selective etch material.

One advantage of the present invention is that the thin layer of the dielectric material protects the support surface from pitting resulting from the etching of the membrane to form the trenches that define the platform and the flexures. Therefore, the problems associated with the pitting of the prior methods for fabricating a suspended structure are solved by the present invention.

Additionally, the present invention eliminates the need to perforate the platform in order to provide a path for the etch material to get to the dielectric layer beneath the platform. The trenches provide the necessary path for the etch material to get to the dielectric layer. Consequently, the platform of the present invention is devoid of holes, perforations, or the like that reduce the surface area of the platform.

In one embodiment of the present invention, prior to forming the well, the dielectric layer is planarized to form a substantially planar interface surface.

In another embodiment of the present invention, the dielectric layer is silicon oxide.

In yet another embodiment of the present invention, a thickness of the base substrate is reduced by backthinning a back surface of the base substrate.

In one embodiment of the present invention, the selective etch material is hydrofluoric acid.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 1b through 1d are a cross-sectional view taken along line AA of FIG. 1a that illustrate a process for fabricating the prior structure of FIG. 1a.

FIGS. 2b through 2c are a cross-sectional view taken along line AA of FIG. 2a that illustrate a process for fabricating the prior structure of FIG. 2a.

DETAILED DESCRIPTION

Figure 1A:
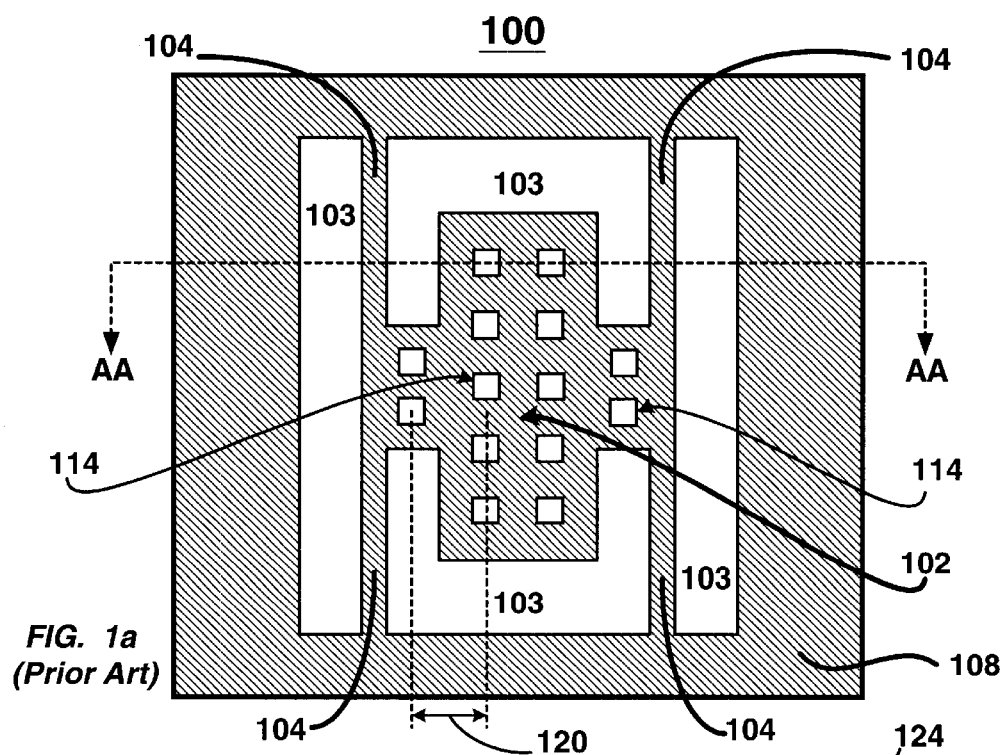
FIG. 1a is a plan view illustrating a prior structure that includes holes that perforate a platform.
Figure 1B:
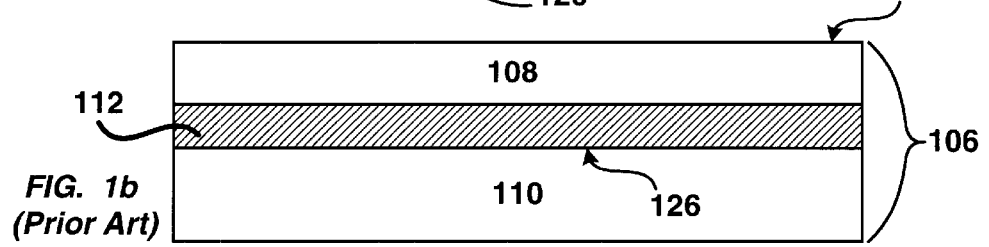
Figure 1C:
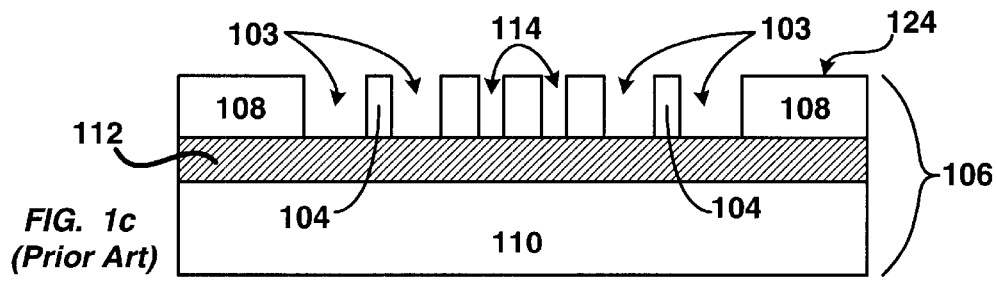
Figure 1D:
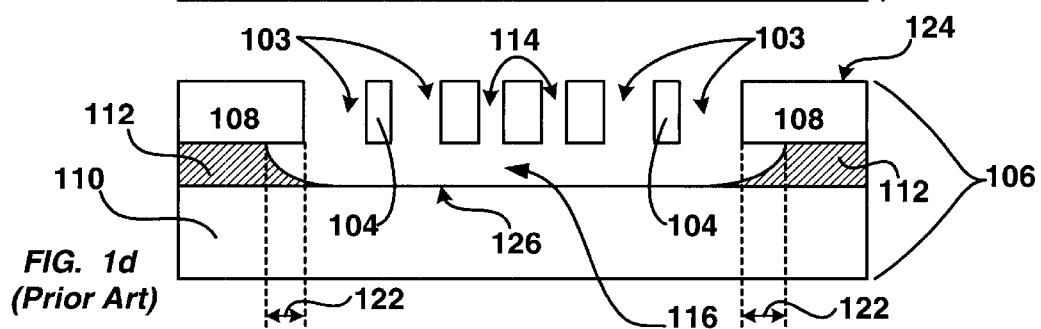
Figure 2A:
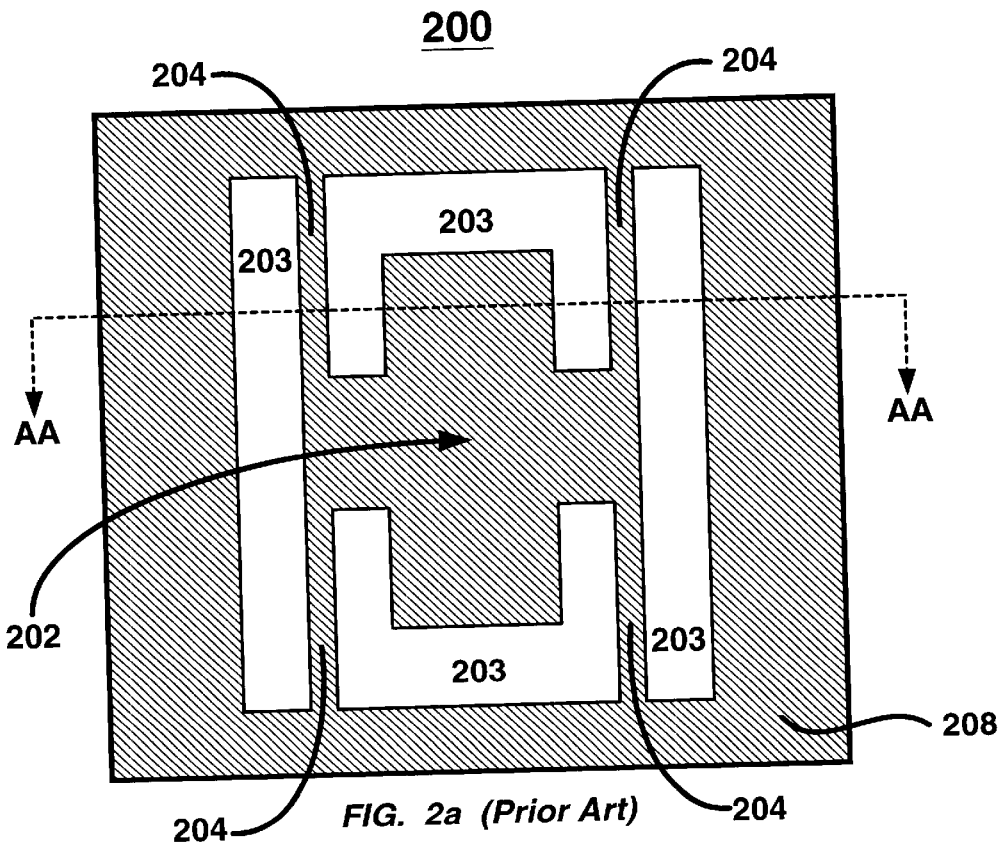
FIG. 2a is a plan view illustrating a prior structure that includes pitting of an upper surface of a lower wafer.
Figure 2B:
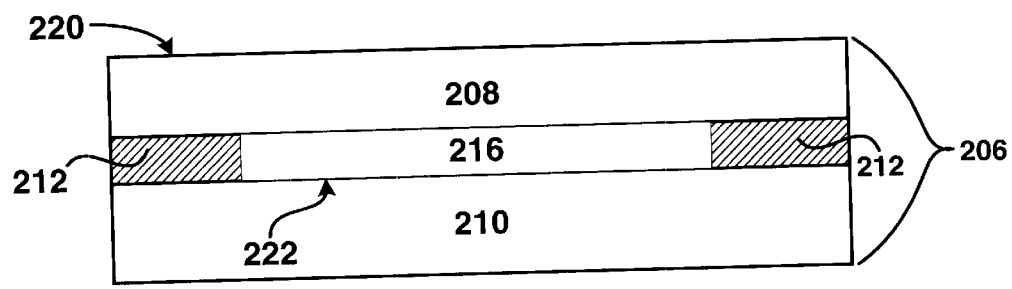
Figure 2C:
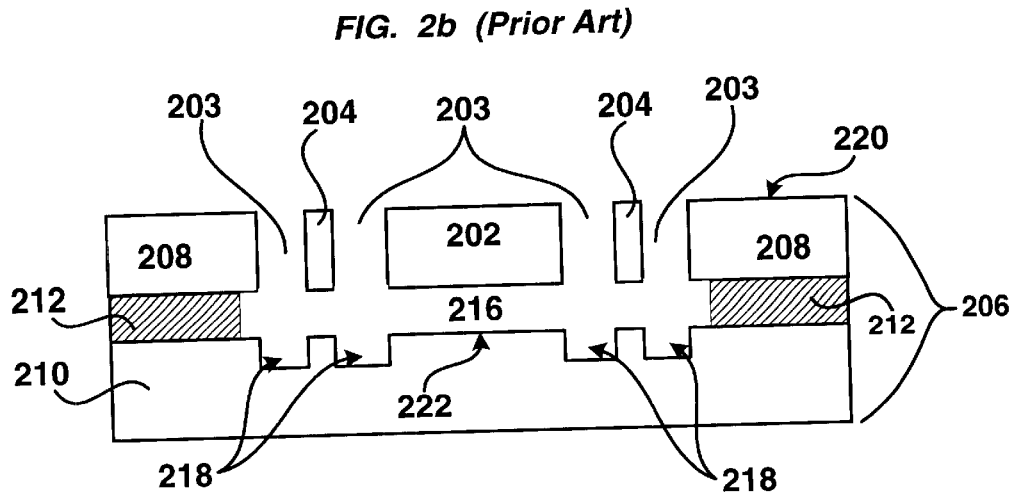

In the following detailed description and in the several figures of the drawings, like elements are identified with like reference numerals.

As shown in the drawings for purpose of illustration, the present invention is embodied in a method of fabricating a suspended platform on a bonded-substrate that includes a platform substrate that is bonded to a base substrate. The method of fabricating the suspended platform results in a suspended platform that is nonperforate. That is, the suspended platform does not include holes or the like that reduce the surface area of the suspended platform. Moreover, the method of fabricating the suspended platform protects a support surface of the base substrate so that the support surface is not pitted due to etching processes that are necessary to form the suspended platform.

The method of fabricating a suspended platform on a bonded-substrate includes a platform substrate that is bonded to a base substrate. A dielectric layer is formed on a support surface of the base substrate and then an interface surface of the dielectric layer is patterned and etched to form a well that extends inward of the interface surface. The well has a preselected depth that leaves a thin layer of the dielectric layer covering the support surface. The base and platform substrates are then chemically bonded to each other to form the bonded-substrate. The interface surface and a mounting surface of the platform substrate are urged into contact with each other and then the base and platform substrates are annealed to fusion bond the interface surface with the mounting surface.

Once bonded, the well and the mounting surface form a sealed cavity therebetween. The platform substrate is thinned so that the material from which the platform substrate is made forms a thin membrane over the sealed cavity. The membrane is then patterned to define a platform feature and a flexure feature. Next, the membrane is etched to form deep trenches that extend all the way trough the membrane to the sealed cavity. The trenches define a suspended platform (also called a microstructure) and one or more flexures that connect the suspended platform with the platform substrate. Finally, the dielectric material beneath the suspended platform and the flexures is removed by applying a selective etch material. The selective etch material removes substantially all of the dielectric material from beneath the suspended platform and the flexures without substantially undercutting an interface between the interface layer and the mounting surface so that the chemical bond between the base substrate and the platform substrate is not damaged by the selective etch material. Furthermore, the selective etch material frees the suspended platform and the flexures from the dielectric layer.

Figure 3A:
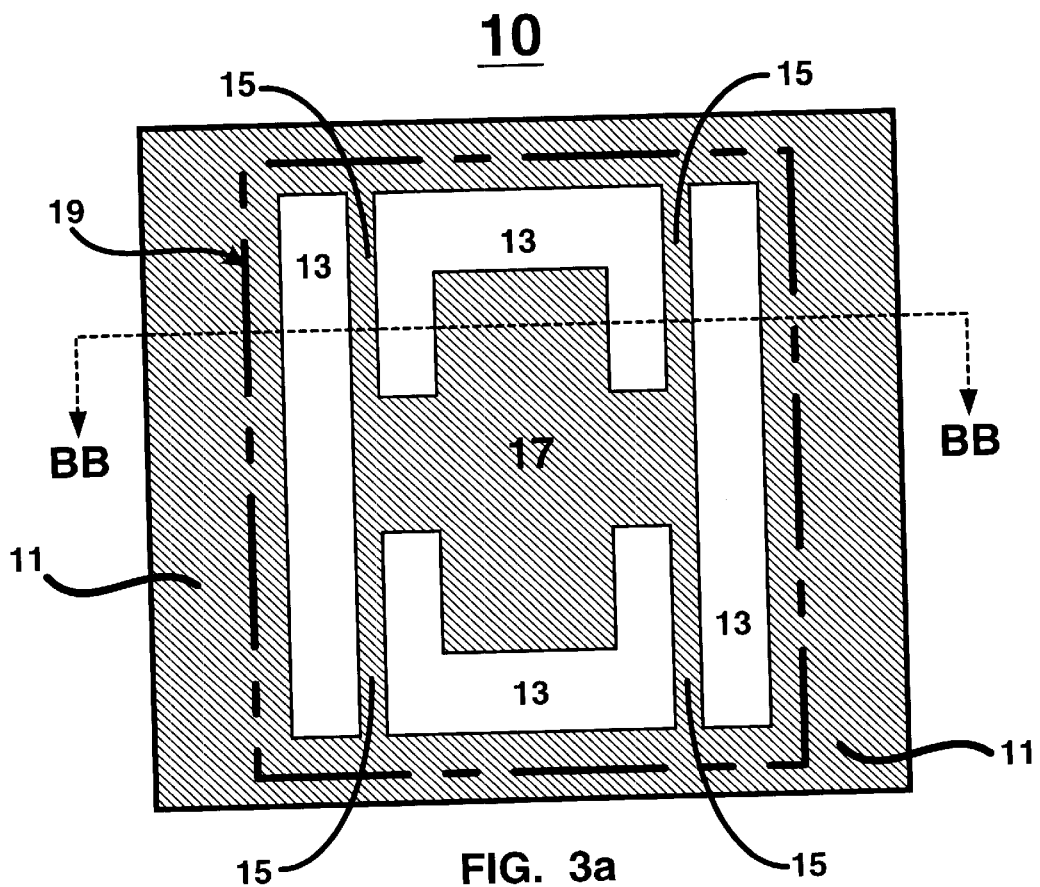
FIG. 3a is a plan view illustrating a non-perforate suspended platform according to the present invention.

In FIG. 3a, a system 10 includes a platform substrate 11 having trenches 13 formed therein to define at least one flexure 15 (four are shown) and a suspended platform 17 that is connected with the platform substrate 11 by the flexures 15. The trenches 13 extend through the platform substrate 11 to a cavity (not shown) positioned below the platform substrate 11. The cavity can have an area 19 (dashed lines) that is greater than or equal to the combined area of the suspended platform 17 and the flexures 15.

Unlike prior suspended structures, the suspended platform 17 of the present invention is non-perforate. That is, the suspended platform 17 is free of through holes, perforations, or the like that extend through the suspended platform 17 to the cavity below. Accordingly, substantially all of the surface area of the suspended platform 17 is available for use in applications that require a suspended platform that is free of surface anomalies such as perforations. For instance, if the suspended platform 17 will be used for data storage, then it is desirable to have as much of the surface area of the suspended platform 17 available to store data. On the other hand, perforations or the like subtract from the surface area available for data storage. For example, if the suspended platform 17 is coated with a phase change media for storing data, then the perforations represent an area that cannot support the phase change media.

Figure 3B:
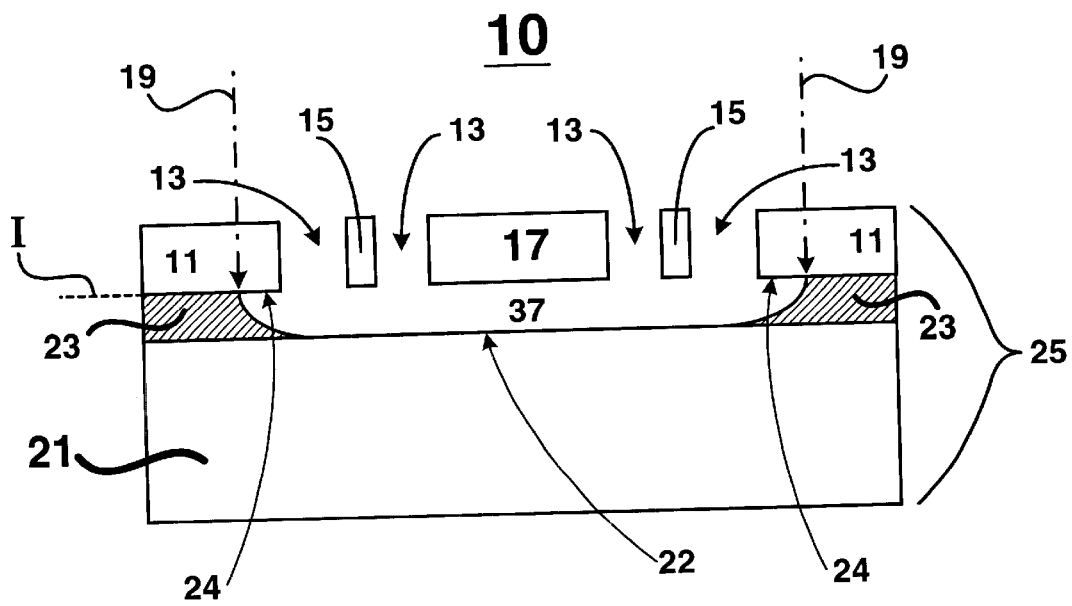
FIG. 3b is a cross-sectional view taken along line BB of FIG. 3a illustrating a suspended platform, flexures, and a support surface of a base substrate that is devoid of pitting according to the present invention.

In FIG. 3b, the system 10 is illustrated in a cross-sectional view taken along line BB of FIG. 3a. A cavity 37 is positioned below the suspended platform 17 and the flexures 15. The cavity 37 can extend beyond the area of the suspended platform 17 and the flexures 15 as shown by dashed arrow 19 such that the cavity 37 has an area that can be greater than or equal to the combined area of suspended platform 17 and the flexures 15. The cavity 37 is defined by a support surface 22 of the base substrate 21 and a mounting surface 24 of the platform substrate 11. The system 10 includes a base substrate 21 and a dielectric layer 23 that chemically bonds the base substrate 21 and the platform substrate 11 to each other to form a bonded-substrate 25.

In contrast to prior suspended structures, the fabrication of the suspended platform 17 and the flexures 15 of the present invention does not result in pitting of the support surface 22 because that support surface 22 is protected by a thin layer of the dielectric material 23 as will be discussed below.

Figure 4A:
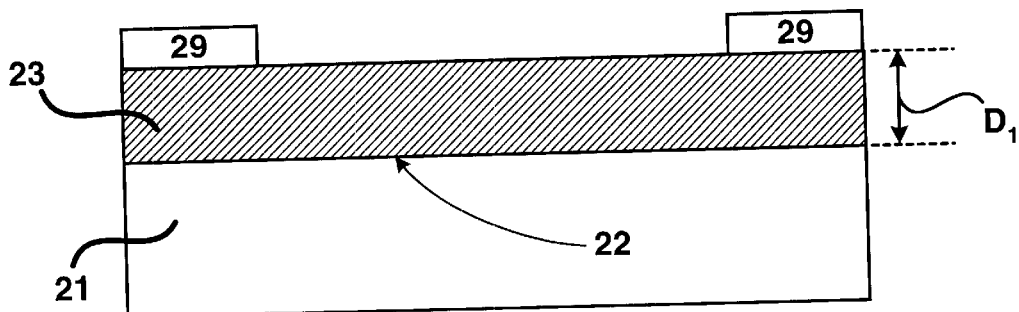
FIGS. 4a through 4g are cross-sectional views illustrating a process for fabricating a suspended platform according to the present invention.

FIGS. 4a through 4g illustrate a method of fabricating a suspended platform on a bonded-substrate according to the present invention. In FIG. 4a, the bonded substrate 25 as illustrated in FIG. 3b can be formed by depositing a thin dielectric layer 23 on a support surface 22 of a base substrate 21. The dielectric layer 23 is an electrically insulating material, preferably silicon oxide ($SiO_2$). The dielectric layer 23 can have a thickness $D_1$ that is from about 0.5 pm thick to about 2.0 $\mu$m thick.

A well 31 is formed in the dielectric layer 23 by patterning and then etching the dielectric layer 23. For instance, a photoresist pattern 29 can be used to define the well 31 and an uncovered portion of the dielectric layer 23 can be exposed to an etchant that dissolves the uncovered portion of the dielectric layer 23 to form the well 31. An etchant such as a hydrofluoric acid (HF) solution can be used to etch the well 31. If the dielectric layer 23 is $SiO_2$, then HF is a preferred etchant. However, the etchant used is not limited to HF and other etchants such as a $CHF_3$ or other fluorine based plasma etchants may also be used.

Prior to forming the well 31, it may be desirable to planarize the dielectric layer 23 so that the dielectric layer 23 has a substantially planar interface surface 27 upon which a platform substrate (not shown) will be mounted as will be discussed below. As a result of the planarization, the dielectric layer 23 will have a thickness $D_2$ (see FIG. 4b) that is less than the deposited thickness of $D_1$. Processes well known in the microelectronics fabrication art can be used to planarize the dielectric layer 23. For instance grinding, polishing, lapping, and chemical mechanical planarization (CMP) can be used. Preferably, CMP is used to form the substantially planar interface surface 27 (interface surface 27 hereinafter). After planarization, the dielectric layer 23 can have a thickness $D_2$ that is from about 0.5 $\mu$m thick to about 2.0 $\mu$m thick.

Figure 4B:
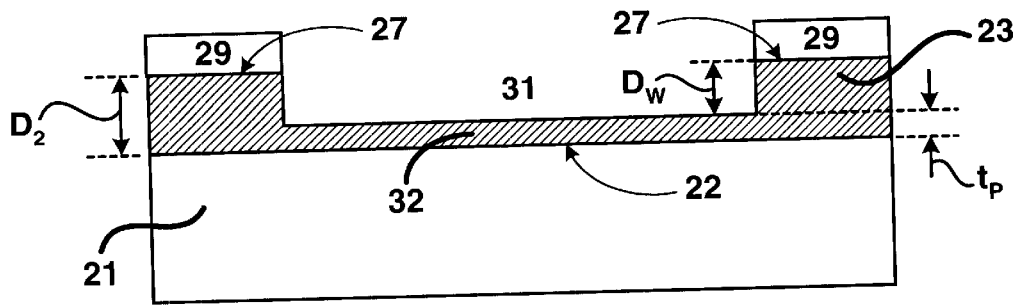

In FIG. 4b, the well 31 is etched until it has a preselected depth $D_w$ that leaves a thin protective layer 32 of the dielectric layer 23 covering the support surface 22. The thin protective layer 32 should have a thickness $t_p$ that is selected to prevent the support surface 22 from being pitted by a subsequent etch process as will be described below in reference to FIGS. 4f and 4g. The preselected depth $D_w$ will vary based on the type of material for the dielectric layer 23, the etching material used to etch the well 31 and process parameters such as etching time.

For example, if the dielectric layer 23 has a thickness ($D_1$ or $D_2$) that is from about 0.5 $\mu$m thick to about 2.0 $\mu$m thick, then the preselected depth $D_w$ can be from about 0.4 $\mu$m to about 1.9 $\mu$m.

As another example, if the dielectric layer 23 has a thickness ($D_1$ or $D_2$) equal to 1.8 $\mu$m, then the preselected depth $D_w$ can be 1.6 $\mu$m and the thin protective layer 32 can a thickness $t_p$ that is about 0.20 $\mu$m or less. The preselected depth $D_w$ should be selected so that the thickness $t_p$ will be sufficient to protect the support surface 22 from pitting or damaged resulting from a subsequent etching step that complete removes the dielectric layer 23 as will be discussed below. In general, the thickness $t_p$ will be approximately equal to ($D_1-D_w$) or to ($D_2-D_w$).

Figure 4C:
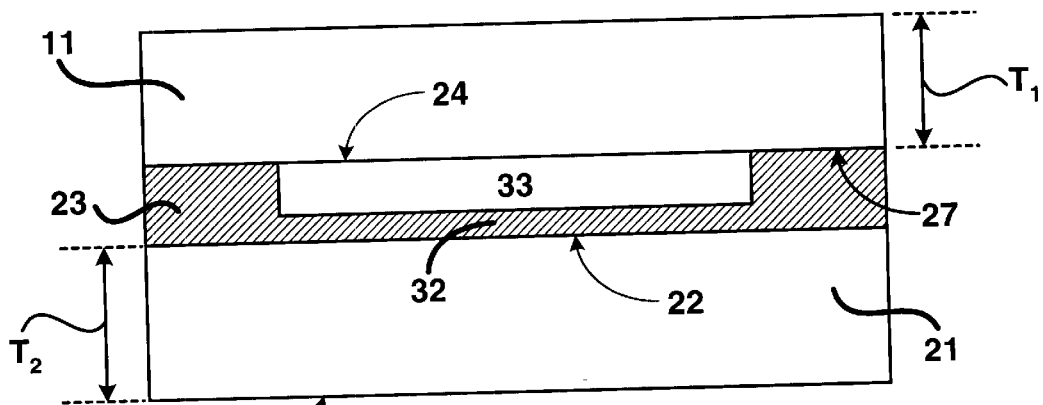

In FIG. 4c, the base substrate 21 is bonded to a platform substrate 11 to form the bonded-substrate 25 (see FIG. 3b) by urging the interface surface 27 into contact with a mounting surface 24 of the platform substrate 11. The base and platform substrates (11, 21) are then heated (i.e. annealed) to fusion bond the interface surface 27 with the mounting surface 24. The base and platform substrates (11, 21) can be bonded to each other using substrate bonding processes that are well understood in the microelectronics arts. For instance, if the base and platform substrates (11, 21) are made from a single crystal silicon material and the dielectric layer 23 is $SiO_2$, then the base and platform substrates (11, 21) can be annealed in an inert ambient at a temperature from about 700 degrees centigrade to about 900 degrees centigrade to form a fused $SiO_2$ layer between the base and platform substrates (11, 21) that chemically bonds them to each other.

As a result of bonding the base and platform substrates (11, 21) to each other, a sealed cavity 33 defined by the well 31 and the interface surface 27 is formed.

Figure 4D:
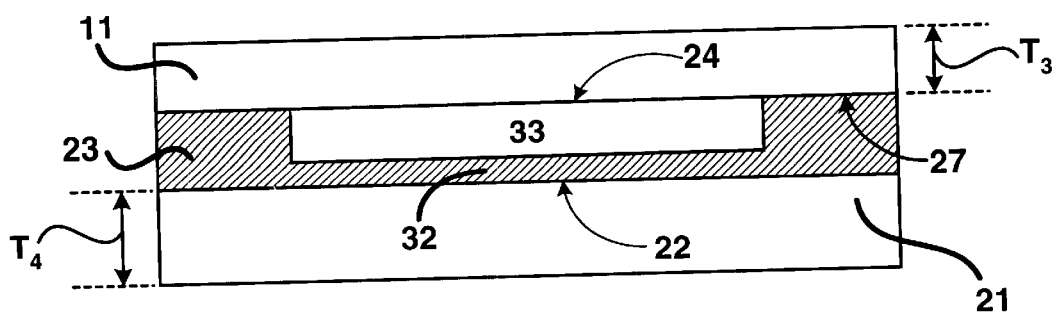

In FIG. 4d, the platform substrate 11 is thinned from an initial thickness $T_1$ (see FIG. 4c) to a reduced thickness $T_3$ to form a thin membrane of the platform substrate 11 over the sealed cavity 33 (hereinafter, the membrane and the platform substrate will be denoted by the reference numeral 11). In some applications it may be desirable to reduce the thickness of the base substrate 21 by backthinning a back surface 30 the base substrate 21 from a thickness $T_2$ (see FIG. 4c) to a thickness $T_4$. Depending on the types of structures to be formed on the platform substrate 11, it may be desirable to thin the base substrate 21 prior to defining and forming those structures on the platform substrate 11 so as not to damage those structures as a result of the backthinning process. Preferably, the thickness $T_3$ of the membrane 11 is from about 10.0 $\mu$m to about 200.0 $\mu$m. Other thicknesses are certainly possible and the thickness $T_3$ of the membrane 11 is not limited to the range set forth above. If the membrane 11 is to thin (i.e. <10.0 $\mu$m), then there is the possibility that the membrane 11 will be prone to damage. In contrast, if the membrane 11 is too thick (i.e. >200 $\mu$m), then it becomes increasingly harder to etch any structure into the membrane 11.

Thinning of the platform substrate 11 and backthinning of the base substrate 21 can be accomplished using a process such as grinding, polishing, lapping, and chemical mechanical planarization (CMP). Preferably, CMP is used to thin the platform substrate 11 and for backthinning of the base substrate 21.

The thickness $T_4$ of the base substrate 21 can be from about 200.0 $\mu$m to about 600.0 $\mu$m. Typically, a single crystal silicon (Si) wafer is used for the base substrate 21. Wafers that are thinner than about 300.0 $\mu$m can be fragile and difficult to handle. Therefore, the actual thickness for the base substrate 21 may be determined by the type of material for the base substrate 21 and by handling and breakage considerations. Moreover, a single crystal silicon (Si) wafer can be used for the platform substrate 11. There is no preferred crystalline orientation for the single crystal silicon (Si) wafer material used for the base substrate 21 or for the platform substrate 11. For instance, single crystal silicon (Si) wafers with a (100) or a (111) crystalline orientation can be used.

Figure 4E:
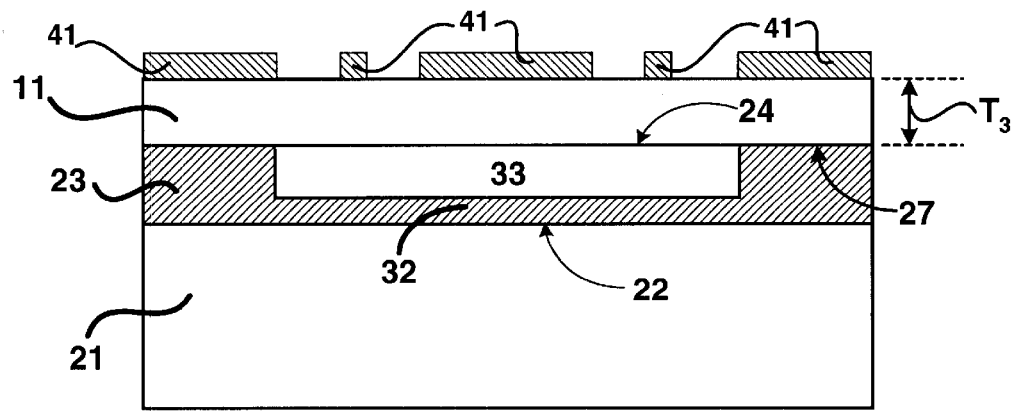

In FIG. 4e, a portion of the membrane 11 is patterned to define a flexure feature and a platform feature. For instance, a photoresist pattern 41 can be used to define the flexure and platform features.

Figure 4F:
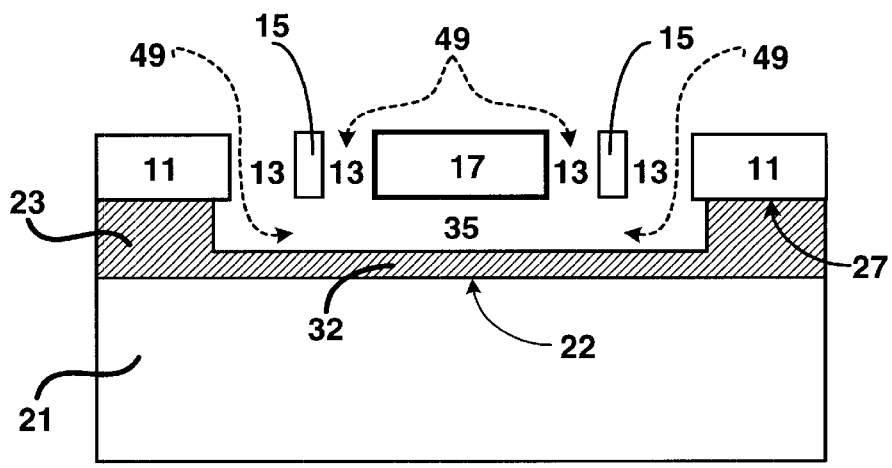

In FIG. 4f, the flexure and platform features are then etched (see dashed arrows 49) to form trenches 13 that extend through the membrane 11 to the sealed cavity 33 thereby forming an open cavity 35. The thin protective layer 32 protects the support surface 22 from the material used to etch the trenches 13. As was mentioned above, one of the advantages of the present invention is that the support surface 22 is not damaged by the above etching process so that the support surface 22 is devoid of pits or the like that could damage components that are carried by or are buried in the base substrate. The trenches 13 also define a suspended platform 17 and a flexure 15.

Figure 4G:
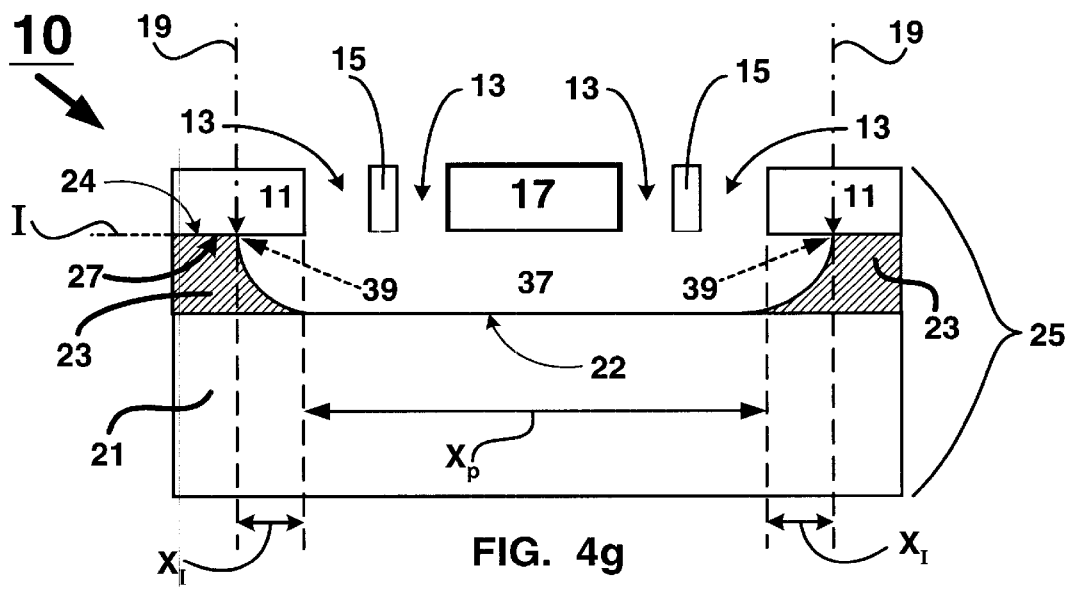

In FIG. 4g, any portion of the dielectric layer 23 that remain beneath the suspended platform 17 and the flexure 15 (i.e. in the open cavity 35) is removed by applying a selective etch material to the bonded-substrate 25. The selective etch material enters the open cavity 35 via the trenches 13. The selective etch material has a differential etch rate that is selected to etch the dielectric layer 23 beneath the suspended platform 17 and the flexure 15 at a substantially faster etch rate than the dielectric layer 23 at an interface I between the interface surface 27 and the mounting surface 24. Accordingly, the etch proceeds substantially faster across that portion of the open cavity 35 that is beneath the suspended platform 17 and the flexure 15 as shown by arrow $X_p$ such that the dielectric layer is completely removed from beneath the suspended platform 17 and the flexure 15. In contrast, the etch proceeds substantially slower at the interface I such that the dielectric layer 23 at the interface I is undercut 39 by a minimal distance as shown by arrows $X_I$.

Preferably, a wet etch material such as hydrofluoric acid (HF) is used for the selective etch material. Hydrofluoric acid (HF) is an isotropic etchant that has a differential etch rate across the open cavity 35 (see arrow $X_p$) that is about 10×(i.e. about ten times) the differential etch rate at the interface I (see arrows $X_I$). For example, with silicon oxide ($SiO_2$) for the dielectric layer 23, the differential etch rate (using a HF etchant) allows the dielectric layer 23 beneath a 2.0 millimeter (mm) suspended platform 17 to be completely removed while only undercutting about 100 microns (i.e. $X_I \approx 100.0$ $\mu$m) of the dielectric layer 23 from the interface I. As a result of the undercutting, the area 19 of the cavity 35 is greater than the area of the suspended platform 17.

Accordingly, HF works well because it is an isotropic etchant and the HF flows beneath the suspended platform 17 and the flexure 15 and removes the dielectric layer 23. Preferably, the dielectric layer 23 is made from silicon oxide ($SiO_2$). HF is also highly selective to silicon (Si) so that it does not lead to pitting of the support surface 22. Other isotropic $SiO_2$ etchants can be used. For instance, a vapor phase HF (rather than a conventional aqueous HF solution) etchant can be used.

Although several embodiments of the present invention have been disclosed and illustrated, the invention is not limited to the specific forms or arrangements of parts so described and illustrated. The invention is only limited by the claims.

What is claimed is:

1. A method of fabricating a suspended platform on a bonded-substrate that includes a platform substrate that is bonded to a base substrate, comprising:

forming a dielectric layer on a support surface of the base substrate;

patterning an interface surface of the dielectric layer to define a well feature thereon;

etching the well feature until a well having a preselected depth that leaves a thin protective layer of the dielectric layer covering the support surface is formed;

bonding the base and platform substrates to each other by urging the interface surface into contact with a mounting surface of the platform substrate and annealing the base and platform substrates to fusion bond the interface surface with the mounting surface;

thinning the platform substrate to form a membrane over a sealed cavity defined by the well and the mounting surface;

patterning the membrane to define a flexure feature and a platform feature;

etching the flexure and platform features to form a plurality of trenches that extend through the membrane to the sealed cavity and define a suspended platform and a flexure; and applying a selective etch material to remove the dielectric layer from beneath the suspended platform and the flexure.

2. The method as set forth in claim 1, wherein prior to patterning the interface surface, the dielectric layer is planarized to form a substantially planar interface surface.

3. The method as set forth in claim 2, wherein the dielectric layer has a thickness from about 0.50 μm to about 2.0 μm.

4. The method as set forth in claim 3, wherein the dielectric layer is silicon oxide.

5. The method as set forth in claim 2, wherein the planarization is accomplished by a process selected from the group consisting of grinding, polishing, and chemical mechanical planarization.

6. The method as set forth in claim 1, wherein the thinning of the platform substrate is accomplished by a process selected from the group consisting of grinding, polishing, lapping, and chemical mechanical planarization.

7. The method as set forth in claim 1, wherein the dielectric layer is silicon oxide and the platform substrate is chemically bonded to the base substrate by a silicon oxide fusion bond.

8. The method as set forth in claim 7, wherein the silicon oxide has a thickness from about 0.50 μm to about 2.0 μm.

9. The method as set forth in claim 1 and further comprising backthinning a back surface of the base substrate to reduce a thickness of the base substrate.

10. The method as set forth in claim 9, wherein the backthinning is accomplished by process selected from the group consisting of lapping, polishing, grinding, and chemical mechanical planarization.

11. The method as set forth in claim 9, wherein after the backthinning, the thickness of the base substrate is from about 200.0 μm to about 600.0 μm.

12. The method as set forth in claim 1, wherein the selective etch material is a hydrofluoric acid solution.

13. The method as set forth in claim 1, wherein the selective etch material has a differential etch rate and the dielectric layer beneath the suspended platform and the flexure is etched at a substantially faster etch rate than the dielectric layer at an interface between the interface surface and the mounting surface.

14. The method as set forth in claim 1, wherein any selected one or both of the platform substrate and the base substrate are made from single crystal silicon.

15. The method as set forth in claim 1, wherein the membrane has a thickness from about 10.0 μm to about 200.0 μm.

16. The method as set forth in claim 1, wherein the predetermined depth of the well is from about 0.40 μm to about 1.9 μm.

17. The method as set forth in claim 1, wherein the thin protective layer has a thickness less than about 0.20 μm.

* * * * *